(12) United States Patent
Kondo (10) Patent No.: US 8,451,706 B2
(45) Date of Patent: May 28, 2013

(54) VERTICAL CAVITY SURFACE EMITTING LASER, VERTICAL-CAVITY-SURFACE-EMITTING-LASER DEVICE, OPTICAL TRANSMISSION APPARATUS, AND INFORMATION PROCESSING APPARATUS

(75) Inventor: Takashi Kondo, Kanagawa (JP)

(73) Assignee: Fuji Xerox Co., Ltd., Tokyo (JP)

(*) Notice: Subject to any disclaimer, the term of this patent is extended or adjusted under 35 U.S.C. 154(b) by 278 days.

(21) Appl. No.: 13/086,748

(22) Filed: Apr. 14, 2011

(65) Prior Publication Data

US 2012/0147727 A1    Jun. 14, 2012

(30) Foreign Application Priority Data

Dec. 10, 2010 (JP) .................. 2010-275274

(51) Int. Cl.
*H01S 5/183* (2006.01)
*H04B 10/04* (2006.01)

(52) U.S. Cl.
USPC ............. 369/121; 369/13.01; 372/50.124; 372/45.01; 372/46.01; 372/46.013

(58) Field of Classification Search
USPC .......... 369/121–123, 13.01, 13.06, 13.07; 372/45.01, 46.01, 46.013, 50.11, 50.124, 372/43.01
See application file for complete search history.

(56) References Cited

U.S. PATENT DOCUMENTS

| | | | |
|---|---|---|---|
| 7,016,392 B2 * | 3/2006 | Tandon et al. | 372/96 |
| 7,218,660 B2 | 5/2007 | Koelle et al. | |
| 2010/0322669 A1 * | 12/2010 | Takeuchi et al. | 399/221 |
| 2011/0318020 A1 * | 12/2011 | Kondo et al. | 398/182 |

FOREIGN PATENT DOCUMENTS

| | | |
|---|---|---|
| EP | 2 063 504 A2 | 5/2009 |
| JP | A-2005-108983 | 4/2005 |
| JP | A-2009-152553 | 7/2009 |

OTHER PUBLICATIONS

Unold et al.; "Improving Single-Mode VCSEL Performance by Introducing a Long Monolithic Cavity;" *IEEE Phototronics Techonology Letters*; Aug. 2000; pp. 939-941; vol. 12, No. 8., IEEE.
Mahmoud et al.; "Analysis of longitudinal mode wave guiding in vertical-cavity surface emitting lasers with long monolithic cavity;" *Applied Physics Letters*; Jan. 29, 2001; vol. 78, No. 5; American Institute of Physics.

* cited by examiner

*Primary Examiner* — Wayne Young
*Assistant Examiner* — Dionne Pendleton
(74) *Attorney, Agent, or Firm* — Oliff & Berridge, PLC (57) ABSTRACT

A vertical cavity surface emitting laser includes a semiconductor substrate, a first semiconductor multilayer film reflector of a first conductivity type laminated on the semiconductor substrate, a resonator, and a second semiconductor multilayer film reflector of a second conductivity type laminated on the resonator. In each of the first and second semiconductor multilayer film reflectors, a pair of a high-refractive-index layer and a low-refractive-index layer is stacked. The resonator includes an active layer laminated on the first semiconductor multilayer film reflector. The resonator includes a pair of spacer layers and a resonator extending region. A composition of at least a layer included in the resonator extending region is different from any of compositions of the semiconductor substrate, the first semiconductor multilayer film reflector, and the second semiconductor multilayer film reflector.

13 Claims, 5 Drawing Sheets

VERTICAL CAVITY SURFACE EMITTING LASER, VERTICAL-CAVITY-SURFACE-EMITTING-LASER DEVICE, OPTICAL TRANSMISSION APPARATUS, AND INFORMATION PROCESSING APPARATUS

CROSS-REFERENCE TO RELATED APPLICATIONS

This application is based on and claims priority under 35 USC 119 from Japanese Patent Application No. 2010-275274 filed Dec. 10, 2010.

BACKGROUND

(i) Technical Field

The present invention relates to a vertical cavity surface emitting laser, a vertical-cavity-surface-emitting-laser device, an optical transmission apparatus, and an information processing apparatus.

SUMMARY

According to an aspect of the invention, there is provided a vertical cavity surface emitting laser including a semiconductor substrate, a first semiconductor multilayer film reflector, a resonator, and a second semiconductor multilayer film reflector. The first semiconductor multilayer film reflector is laminated on the semiconductor substrate, and is of a first conductivity type. In the first semiconductor multilayer film reflector, a pair of a high-refractive-index layer having a comparatively high refractive index and a low-refractive-index layer having a low refractive index is stacked. The resonator includes an active layer laminated on the first semiconductor multilayer film reflector. The second semiconductor multilayer film reflector is laminated on the resonator, and is of a second conductivity type that is different from the first conductivity type. In second semiconductor multilayer film reflector, a pair of a high-refractive-index layer having a comparatively high refractive index and a low-refractive-index layer having a low refractive index is stacked. An optical thickness of the resonator is larger than an emission wavelength of the vertical cavity surface emitting laser. At least two resonant wavelengths are within a reflection wavelength band of at least one of the first and second semiconductor multilayer film reflectors. The resonator includes a pair of spacer layers that are laminated on the top and bottom of the active layer and a resonator extending region that is formed so as to be adjacent to one of the pair of spacer layers. A composition of at least a layer included in the resonator extending region is different from any of compositions of the semiconductor substrate, the first semiconductor multilayer film reflector, and the second semiconductor multilayer film reflector. A lattice constant of a crystal forming the resonator extending region is smaller than a lattice constant of a crystal forming the first or second semiconductor multilayer film reflector.

BRIEF DESCRIPTION OF THE DRAWINGS

Exemplary embodiment(s) of the present invention will be described in detail based on the following figures, wherein.

DETAILED DESCRIPTION

Next, exemplary embodiments of the present invention will be described with reference to the drawings. Vertical cavity surface emitting lasers (VCSELs) are utilized as light sources of communication apparatuses or image forming apparatuses. Regarding a vertical cavity surface emitting laser that is utilized as such a light source, there is a demand for, in single transverse-mode oscillation, increase of optical power or electro static discharge (ESD) tolerance, and in contrast, there is a demand for prolonging of the life of an element by reducing a resistance value or a heat release property.

In a selective-oxidation-type vertical cavity surface emitting laser, single transverse-mode oscillation is obtained by reducing the oxide aperture diameter of a current confinement layer to be about 3 µm. However, if the oxide aperture diameter is reduced, the resistance of an element is increased, and the heating temperature is also increased. This causes the life of the element to be shortened. Furthermore, if the oxide aperture diameter is reduced, the optical power is also reduced. Increase of the resonator length is considered as a method for realizing high optical power and extension of the life of a vertical cavity surface emitting laser. A vertical cavity surface emitting laser having a long resonator structure typically includes a cavity having a resonator length that has increased by a value that is in a range of about 3 µm to 4 µm (by a value that is in a range of about ten times to twenty times an emission wavelength). When the resonator length is increased, the difference between optical loss in fundamental transverse-mode oscillation, in which the angle of divergence is small, and optical loss in high-order transverse-mode oscillation, in which the angle of divergence is large, is increased. As a result, even if the oxide aperture diameter is increased, single transverse-mode oscillation can be obtained. If a laser is a vertical cavity surface emitting laser having a long resonator structure, the oxide aperture diameter can be increased to be about 8 µm, and the optical power can also be increased to be about 5 mW.

In the description given below, selective-oxidation-type vertical cavity surface emitting lasers having a long resonator structure are provided by way of examples, and referred to as "VCSELs". It should be noted that, the scale of devices and apparatuses in the figures is enhanced in order to easily understand the features of the invention, and is not necessarily the same as the scale of the devices and apparatuses in reality.

EXEMPLARY EMBODIMENTS

Figure 1:
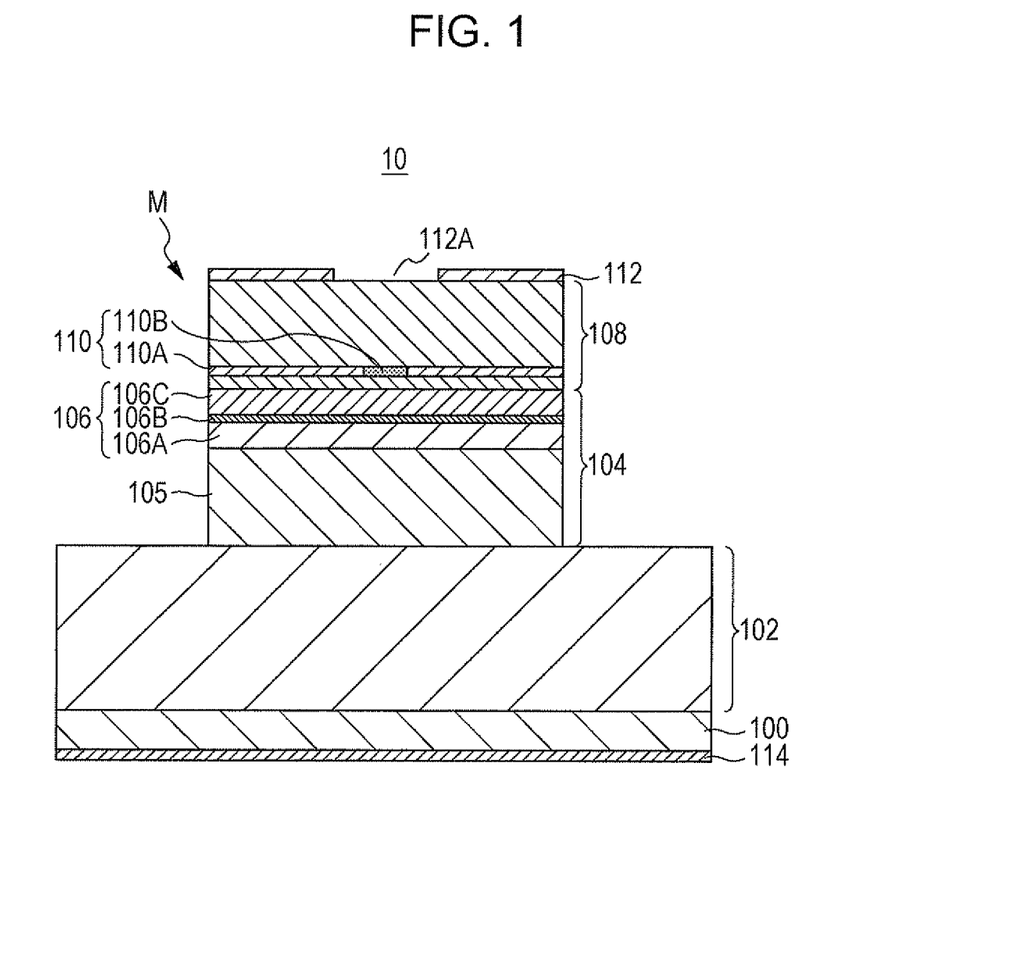
FIG. 1 is a schematic cross-sectional view of a VCSEL having a long resonator structure according to a first exemplary embodiment of the present invention.

FIG. 1 is a schematic cross-sectional view of a VCSEL having a long resonator structure according to a first exemplary embodiment of the present invention. As illustrated in FIG. 1, a VCSEL 10 according to the present exemplary embodiment is configured so that an n-type lower distributed bragg reflector (DBR) 102, a resonator 104, and a p-type upper DBR 108 are stacked on an n-type GaAs substrate 100. In the lower DBR 102, AlGaAs layers having different aluminum contents are alternately stacked. The resonator 104 is laminated on the lower DBR 102, and provides a long resonator structure. The upper DBR 108 is laminated on the resonator 104, and, in the upper DBR 108, AlGaAs layers having different aluminum contents are alternately stacked.

The n-type lower DBR 102 is configured so that, for example, multiple pairs of an $Al_{0.9}Ga_{0.1}As$ layer and an $Al_{0.3}Ga_{0.7}As$ layer are stacked. The thickness of each $Al_{0.9}Ga_{0.1}As$ layer or $Al_{0.3}Ga_{0.7}As$ layer is $\lambda/4n_r$ (where $\lambda$ is an emission wavelength and $n_r$ is a refractive index of a medium). The $Al_{0.9}Ga_{0.1}As$ layer and the $Al_{0.3}Ga_{0.7}As$ layer are alternately stacked forty times. The carrier concentration of each of the $Al_{0.9}Ga_{0.1}As$ layers and $Al_{0.3}Ga_{0.7}As$ layers that have been doped with silicon which is an n-type impurity is, for example, $3\times10^{18}$ cm$^{-3}$. Furthermore, the p-type upper DBR 108 is configured so that multiple pairs of a p-type $Al_{0.9}Ga_{0.1}As$ layer and a p-type $Al_{0.3}Ga_{0.7}As$ layer are stacked. The thickness of each $Al_{0.9}Ga_{0.1}As$ layer or $Al_{0.3}Ga_{0.7}As$ layer is $\lambda/4n_r$. The $Al_{0.9}Ga_{0.1}As$ layer and the $Al_{0.3}Ga_{0.7}As$ layer are alternately stacked twenty-nine times. The carrier concentration of each of the $Al_{0.9}Ga_{0.1}As$ layers and $Al_{0.3}Ga_{0.7}As$ layers that have been doped with carbon which is a p-type impurity is, for example, $3\times10^{18}$ cm$^{-3}$. Preferably, a contact layer that is composed of p-type GaAs is laminated as the top layer of the upper DBR 108. A current confinement layer 110 that is composed of p-type AlAs is laminated as the bottom layer of the upper DBR 108 or laminated inside the upper DBR 108.

The resonator 104 is configured so as to include a resonator extending region 105 that is laminated on the lower DBR 102, and an active region 106 that is laminated on the resonator extending region 105. The active region 106 includes a quantum well active layer 106B that is sandwiched between a lower spacer layer 106A and an upper spacer layer 106C. Preferably, the thickness of the active region 106 is equal to an emission wavelength $\lambda$. The lower spacer layer 106A is, for example, an undoped $Al_{0.6}Ga_{0.4}As$ layer. The quantum well active layer 106B includes an undoped $Al_{0.11}Ga_{0.89}As$ quantum well layer and an undoped $Al_{0.3}Ga_{0.7}As$ barrier layer. The upper spacer layer 106C is an undoped $Al_{0.6}Ga_{0.4}As$ layer.

The resonator extending region 105 is a monolithic layer that is formed using successive epitaxial growth. The thickness of the resonator extending region 105 is, for example, in a range of about 3 μm to 4 μm. In other words, the optical thickness of the resonator extending region 105 is $16\lambda$ (wherein $\lambda$ is an emission wavelength). In a typical VCSEL, the resonator extending region 105 is not included, and the active region 106 is laminated on the lower DBR 102. The resonator extending region 105 may be referred to as a "cavity extending region" or a "cavity space".

The resonator extending region 105 is composed of a crystal having a lattice constant that coincides with or matches with the lattice constant of GaAs contained in the GaAs substrate 100. In the present exemplary embodiment, the resonator extending region 105 is composed of AlGaAsP that is obtained by adding P (phosphorus) to n-type AlGaAs. The aluminum content of the resonator extending region 105 is selected from a range of 0.3 to 0.9 that is a range of the aluminum content of the lower DBR 102. The phosphorus content of the resonator extending region 105 is determined on the basis of a critical thickness that corresponds to the thickness of the resonator extending region 105, as described below.

Semiconductor layers starting with the upper DBR 108 ending with the lower DBR 102 are etched, thereby forming a mesa (a columnar structure) M having a cylindrical shape on the substrate 100. The current confinement layer 110 is exposed on the side face of the mesa M, and includes an oxidized region 110A which is selectively oxidized from the side face, and an electrically conductive region (oxide aperture) 110B around which the oxidized region 110A is formed. The shape of a cross-section plane, which exists in a plane parallel to the principal plane of the substrate 100, of the electrically conductive region 110B is a circular shape in which the outer shape of the mesa M is reflected. The center of the electrically conductive region 110B almost coincides with an optical axis of the mesa M in the axial direction. In the VCSEL 10 having a long resonator structure, in order to obtain fundamental transverse-mode oscillation, the diameter of the electrically conductive region 110B can be increased, compared with the diameter of a typical VCSEL. For example, the diameter of the electrically conductive region 110B may be increased to be about 7 μm.

A metallic ring-shaped p-side electrode 112 in which layers composed of Ti/Au are stacked is laminated as the top layer of the mesa M. The p-side electrode 112 is in ohmic contact with the contact layer of the upper DBR 108. An opening having a circular shape, i.e., a light emitting aperture 112A from which light is emitted, is formed in the p-side electrode 112. The center of the light emitting aperture 112A coincides with the optical axis of the mesa M. Furthermore, an n-side electrode 114 is formed on the rear face of the substrate 100.

Next, the details of a VCSEL having a long resonator structure according to the present exemplary embodiment will be described. The VCSEL having a long resonator structure has an advantage that, in order to obtain single transverse-mode oscillation, high optical power can be achieved by increasing the diameter of the oxide aperture 110B, compared with an oxide aperture diameter of a typical VCSEL. In contrast, in order to obtain a long resonator structure, the resonator extending region 105 having a thickness of a few micrometers needs to be stacked on the bottom of the active region 106. When the resonator extending region 105 is formed of an AlGaAs layer, because AlGaAs has a lattice constant that is substantially the same as the lattice constant of GaAs, a thickness larger than a certain value does not cause any problem. However, when the thickness of the resonator extending region 105 is in a range of about 2 μm to 4 μm, the thickness of the resonator extending region 105 exceeds a critical thickness, depending on the aluminum content of the resonator extending region 105. Regarding a layer to be stacked, the term "critical thickness" refers to a thickness for maintaining a high crystal quality. For example, when a critical thickness in a case in which the aluminum content of AlGaAs is 30% is calculated from a formula provided by Matthews and Blakeslee, the critical thickness is slightly smaller than 1 μm. Accordingly, the thickness of the resonator extending region 105 exceeds the critical thickness. When the thickness of the resonator extending region 105 exceeds the critical thickness, a crystal defect readily occurs in the resonator extending region 105. The crystal quality of the active region 106 that is formed by vapor deposition on the resonator extending region 105 becomes deteriorated in associated with the crystal defect. Further, this leads to a reduction in reliability such as a reduction in the optical power.

Figure 2:
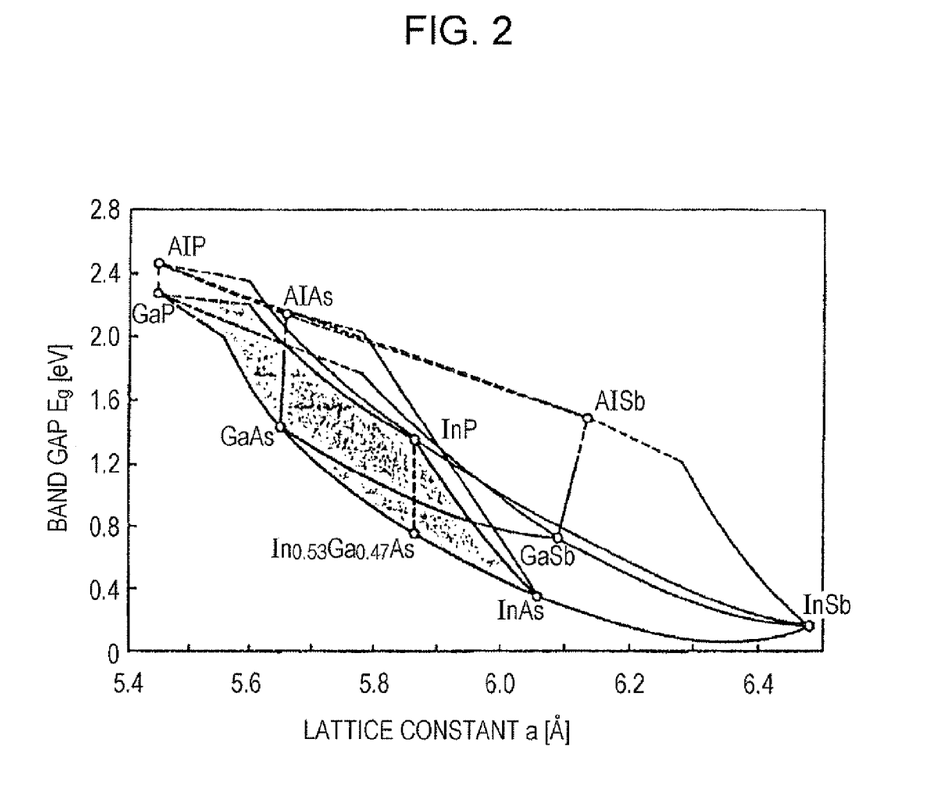
FIG. 2 is a graph illustrating the relationships between lattice constants and band gaps of group III-V compound semiconductors.

FIG. 2 is a graph illustrating the relationships between lattice constants and band gaps of group III-V compound semiconductors. The lattice constant of GaAs is 5.6533 Å. The lattice constant of AlAs is 5.6611 Å. The lattice constant of AlAs is slightly larger than that of GaAs. In contrast, the lattice constant of AlP is 5.4625 Å. The lattice constant of GaP is 5.4512 Å. It is understood that each of the lattice constant of AlP and the lattice constant of GaP is smaller than that of GaAs. Accordingly, the lattice constant of AlGaAs is reduced by adding P to AlGaAs, so that the lattice constant of AlGaAs is made closer to the lattice constant of GaAs. Thus, the critical thickness of the resonator extending region 105 can be increased. For example, when 1% of As contained in an AlGaAs layer having an aluminum content of 30% is replaced with P, the critical thickness is increased to be 8 μm. Furthermore, in addition to AlGaAsP, even when AlGaInP is used, the difference between the lattice constant of AlGaIn and the lattice constant of GaAs can be reduced. Thus, the critical thickness of the resonator extending region 105 can be increased.

When an aluminum content is denoted by x and a phosphorus content is denoted by y, the lattice constant of $Al_xGa_{(1-x)}As_{(1-y)}P_y$ can be calculated from the following expression.

$$x(1-y)AlAs+(1-x)(1-y)GaAs+xyAlP+(1-x)yGaP$$

Here, when the aluminum content is 30% and the phosphorus content is 1%, the lattice constant of $Al_xGa_{(1-x)}As_{(1-y)}P_y$ is calculated as follows.

$$0.3\times(1-0.01)\times5.6611+(1-0.3)(1-0.01)\times5.6533+0.3\times 0.01\times5.4625+(1-0.3)\times0.01\times5.4512=5.65364$$

As a result, the lattice constant of AlGaAsP can be made closer to 5.6533, which is the lattice constant of GaAs, compared with the lattice constant of AlGaAs.

Furthermore, a difference Δa between the lattice constant of GaAs contained in the GaAs substrate and the lattice constant of AlGaAsP contained in an AlGaAsP layer that is stacked is represented by the following equation.

$$\Delta a=\{AlaGa(1-a)As(1-b)Pb - GaAs\}/GaAs$$

The critical thickness can typically be calculated from each of two formulas, i.e., the formula provided by Matthews and Blakeslee and the formula provided by People and Bean. Because different prerequisites are used to derive the two formulas, different values can be calculated. Furthermore, because an actual critical thickness differs in accordance with growth conditions of crystal growth. Accordingly, both of the critical thicknesses calculated from the two formulas are not necessarily accurate. In a case of forming an AlGaAs layer on the GaAs substrate using crystal growth in the present exemplary embodiment, it is considered that the following relationships can be applied.

a critical thickness (calculated from the formula provided by Matthews and Blakeslee)<an actual critical thickness<a critical thickness (calculated from the formula provided by People and Bean)

When an AlGaAs layer is laminated on the GaAs substrate, because the lattice constant of AlGaAs is larger than that of GaAs, a compressive strain is placed on the AlGaAs layer. In contrast, a tensile strain is placed on most of AlGaAsP having a lattice constant that is smaller than the lattice constant of AlGaAs. The tensile strain is the opposite of the compressive strain that is placed on the AlGaAs layer.

In a case in which it is necessary to stack a layer having a certain thickness, when the thickness exceeds the critical thickness, misfit dislocation occurs, so that the crystal quality becomes markedly deteriorated. A strain that does not cause misfit dislocation to occur is represented by the following relationships.

y(a tensile strain)<the amount of strain that is placed on a stacked layer<x(a compressive strain)

Here, relationships x>0 and y<0 are established (a compressive strain is represented by a positive value and a tensile strain is represented by a negative value), and the compressive strain x and the tensile strain y indicate the lower limit and upper limit of the critical thickness, respectively.

However, an equation x=−y is not established. The reason for this is that the relationship between the compressive strain x and the tensile strain y changes in accordance with the difference between the thermal expansion coefficient of a material that the substrate is formed of and the thermal expansion coefficient of a material that the stacked layer is formed of.

In the present exemplary embodiment, when the lower DBR 102 is formed of AlGaAs, the resonator extending region 105 is formed of AlGaAsP. When the phosphorus content is increased, the amount of tensile strain (which is represented by a negative value) is increased. Because the resonator extending region 105 is an AlGaAs layer at a point in time when P has not been added yet, a compressive strain (which is represented by a positive value) is considered as an origin. A thickness of a layer to be grown as the resonator extending region 105 is determined using the upper limit of the phosphorus content, and the upper limit of the phosphorus content is a phosphorus content corresponding to the tensile strain y indicating a critical thickness corresponding to the determined thickness. The thickness is determined using a combination of the aluminum content and the phosphorus content. In other words, when the aluminum content is increased, the compressive strain is increased. When the phosphorus content is increased, the tensile strain is increased. Accordingly, a phosphorus content that reduces occurrence of the compressive strain and the tensile strain may be selected.

The formula provided by Matthews and Blakeslee, from which a critical thickness $h_c$ is calculated, is Formula 1. The formula provided by People and Bean, from which a critical thickness $h_c$ is calculated, is Formula 2. $h_c$ denotes a critical thickness. a denotes the lattice constant of a substrate. Δa denotes the difference between the lattice constant of the substrate and the lattice constant of a layer to be stacked. $C_{xx}$ denotes an elastic stiffness constant.

$$h_c = \frac{a}{2\sqrt{2}\,\pi f}\,\frac{1-0.25v}{1+v}\left(\ln\frac{h_c\sqrt{2}}{a}+1\right) \quad (1)$$

$$f = \frac{\Delta a}{a}$$

$$v = \frac{C_{12}}{C_{11}+C_{12}}$$

$$h_c = \frac{a}{32\sqrt{2}\,\pi f^2}\,\frac{1-v}{1+v}\left(\ln\frac{h_c\sqrt{2}}{a}\right) \quad (2)$$

Figure 3:
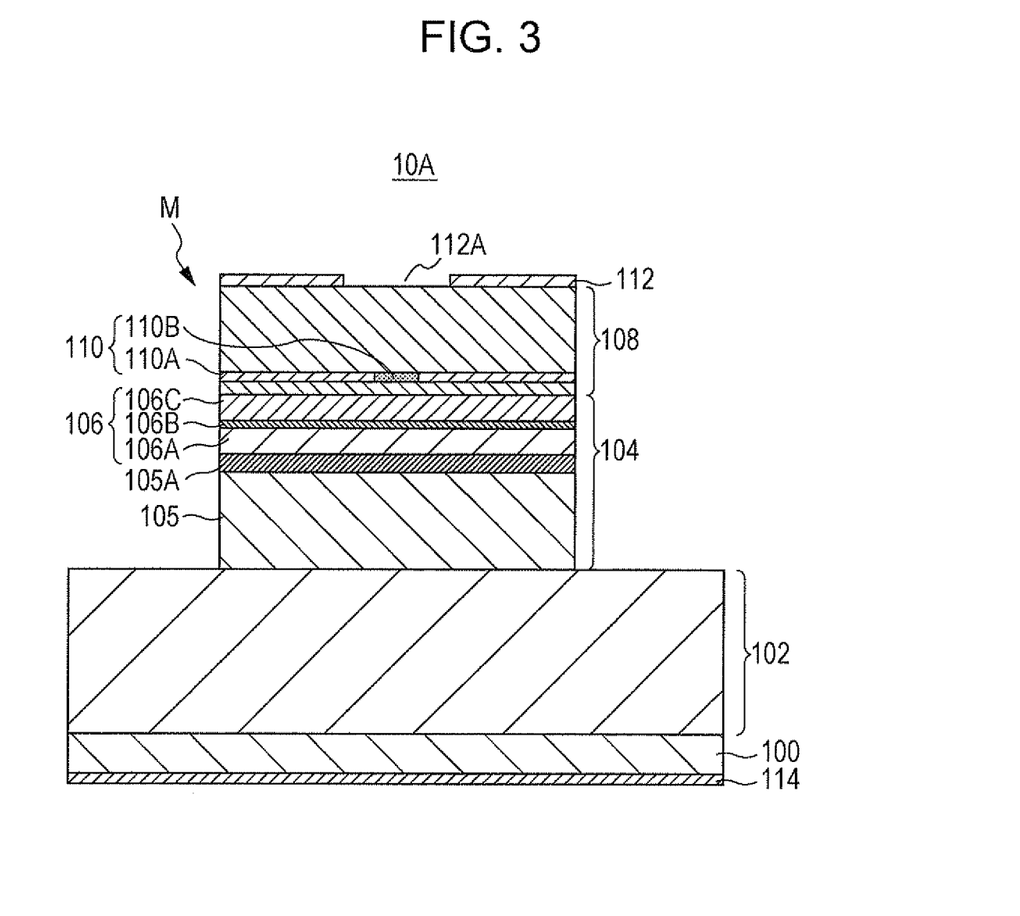
FIG. 3 is a schematic cross-sectional view of a VCSEL having a long resonator structure according to a second exemplary embodiment of the present invention.

Next, a second exemplary embodiment of the present invention will be described. FIG. 3 is a cross-sectional view illustrating a configuration of a VCSEL 10A having a long resonator structure according to the second exemplary embodiment of the present invention. In the VCSEL 10A according to the present exemplary embodiment, the resonator extending region 105 includes an n-type AlGaAs layer 105A that is laminated immediately below the lower spacer layer 106A. The AlGaAs layer 105A may be a single layer. Alternatively, as in the case of the lower DBR 102, the AlGaAs layer 105A may be a layer including one pair of or multiple pairs of AlGaAs layers having different aluminum contents. Oscillation is facilitated by the intervention of the AlGaAs layer 105A.

Next, a process for producing the VCSEL having a long resonator structure that is described in the first exemplary embodiment will be described. Production of the VCSEL is performed using a metalorganic chemical vapor deposition (MOCVD) method. The n-type lower DBR 102, the n-type resonator extending region 105, the active region 106, and the p-type upper DBR 108 are sequentially stacked on the n-type GaAs substrate 100. Each of the layers of the lower DBR 102 is formed so as to have a thickness that is ¼ of a wavelength in a medium. The resonator extending region 105 is formed so as to have a thickness that is 16λ of the wavelength in a medium. The current confinement layer 110 that is composed of p-type AlAs is inserted in the vicinity of the resonator 104 in the upper DBR 108. The p-type GaAs contact layer is formed as the top layer of the upper DBR 108.

Next, the semiconductor layers laminated on the substrate are etched using a photolithographic process that is well known in the art, thereby forming a mesa M having a columnar shape on the substrate. The mesa M has a depth from the top thereof to the lower DBR 102, and the current confinement layer 110 is exposed by the mesa M. Next, an oxidization process is performed, thereby forming the oxidized region 110A and the electrically conductive region 110B, around which the oxidized region 110A is formed, in the current confinement layer 110. The diameter of the electrically conductive region 110B is larger than the diameter of an electrically conductive region in a typical VCSEL, and may be, for example, about 7 µm.

Next, the ring-shaped p-side electrode 112 is formed on the upper DBR 108 using a lift-off process. However, the p-side electrode 112 may be formed on the contact layer of the upper DBR 108 before the mesa M is formed. Next, an SiON film is formed over the entire face of the substrate including the mesa M using chemical vapor deposition (CVD). The SiON film is etched, thereby forming an anisotropic insulating film on the light emitting aperture. Then, the n-side electrode 114 is formed on the rear face of the substrate.

In the above-described exemplary embodiment, the optical thickness of the resonator extending region 105 is set to 16λ. However, the value of the optical thickness is only an example. Any value may appropriately be selected in accordance with the relationships with the critical thickness by adjustment of the phosphorus content. Furthermore, the aluminum contents of AlGaAs layers constituting the lower DBR 102 and the upper DBR 108 may appropriately be selected in accordance with the relationships with a resonant wavelength to be generated or the like.

Moreover, in the above-described exemplary embodiment, an example in which an n-type GaAs substrate is used is described. However, a p-type GaAs substrate may be used. In this case, a p-type lower DBR, a resonator, and an n-type upper DBR are laminated on the substrate. Furthermore, in the above-described exemplary embodiment, the resonator extending region 105 is laminated between the lower spacer layer 106A and the lower DBR 102. However, the resonator extending region 105 may be laminated on the upper spacer layer 1060. Additionally, in the above-described exemplary embodiment, the selective-oxidation-type VCSEL is provided by way of example. However, the current confinement layer may be formed using so-called proton ion implantation. In this case, the mesa is not necessarily necessary. In addition, in the above-described exemplary embodiment, the current confinement layer that is composed of AlAs is provided by way of example. However, the current confinement layer may be an AlGaAs layer having an aluminum content of 90% or higher. Moreover, the oxide aperture diameter of the current confinement layer may appropriately be changed in accordance with required optical power or the like. Furthermore, in the above-described exemplary embodiment, the GaAs-type VCSEL is provided by way of example. However, the present invention may also be applied to other VCSELs having a long resonator structure in which group III-V compound semiconductors are used. Additionally, in the above-described exemplary embodiment, the VCSEL with a single spot is provided by way of example. However, a VCSEL with multiple spots, in which multiple mesas (light emitting portions) are formed on a substrate, or a VCSEL array may be provided by way of example.

Figure 4A:
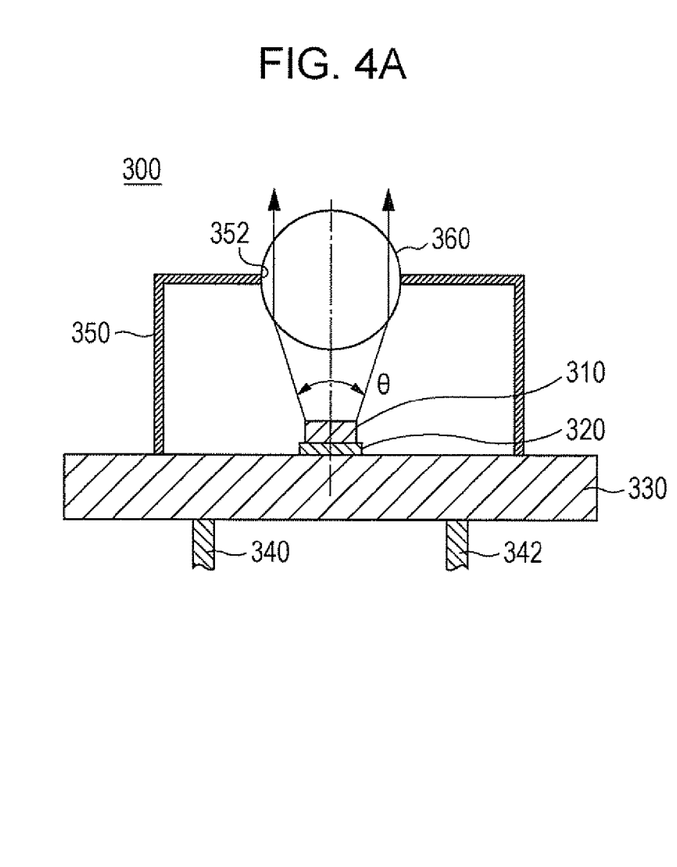
FIGS. 4A and 4B are schematic cross-sectional views illustrating configurations of VCSEL devices in which the VCSEL according to the present exemplary embodiment and an optical member are implemented.

Next, a VCSEL device, an optical information processing apparatus, and an optical transmission apparatus, each of which utilizes the VCSEL according to the present exemplary embodiment, will be described with reference to FIGS. 4A and 4B and FIGS. 5 and 6. FIG. 4A is a cross-sectional view illustrating a configuration of a VCSEL device in which the VCSEL and an optical member are implemented (packaged). A VCSEL device 300 fixes a chip 310, in which the VCSEL having a long resonator structure is formed, on a disk-shaped metallic stem 330 via an electrically conductive adhesive 320. Leads 340 and 342 that are electrically conductive are inserted into through holes (not illustrated) that are formed in the stem 330. The lead 340, which is one of the two leads, is electrically connected to the n-side electrode of the VCSEL, and the lead 342, which is the other lead, is electrically connected to the p-side electrode of the VCSEL.

A rectangular hollow cap 350 is fixed on the stem 330 including the chip 310. A ball lens 360 that is an optical member is fixed in an opening 352 that is provided at the center of the cap 350. The optical axis of the ball lens 360 is positioned so as to almost coincide with the center of the chip 310. When a forward voltage is applied between the leads 340 and 342, laser light is emitted from the chip 310 in the vertical direction. The distance between the chip 310 and the ball lens 360 is adjusted so that the ball lens 360 is included in a region corresponding to an angle θ of divergence of the laser light emitted from the chip 310. Furthermore, a light receiving element or a temperature sensor for monitoring a light emission state of the VCSEL may be included in the cap 350.

Figure 4B:
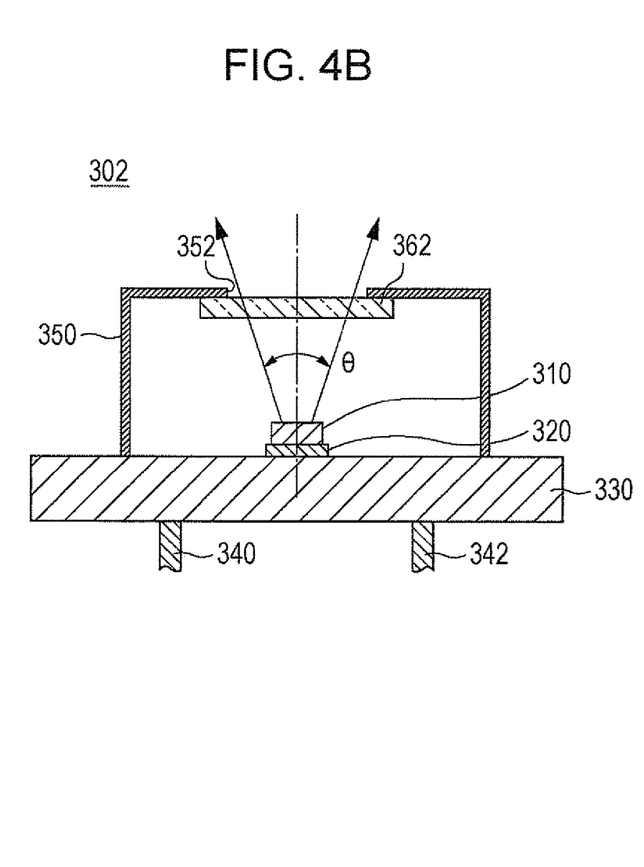

FIG. 4B is a diagram illustrating a configuration of another VCSEL device. A VCSEL device 302 illustrated in FIG. 4B fixes a plate glass 362 in the opening 352 that is provided at the center of the cap 350, instead of using the ball lens 360. The center of the plate glass 362 is positioned so as to almost coincide with the center of the chip 310. The distance between the chip 310 and the plate glass 362 is adjusted so that the diameter of an opening of the plate glass 362 is equal to or larger than a distance corresponding to the angle θ of divergence of the laser light emitted from the chip 310.

Figure 5:
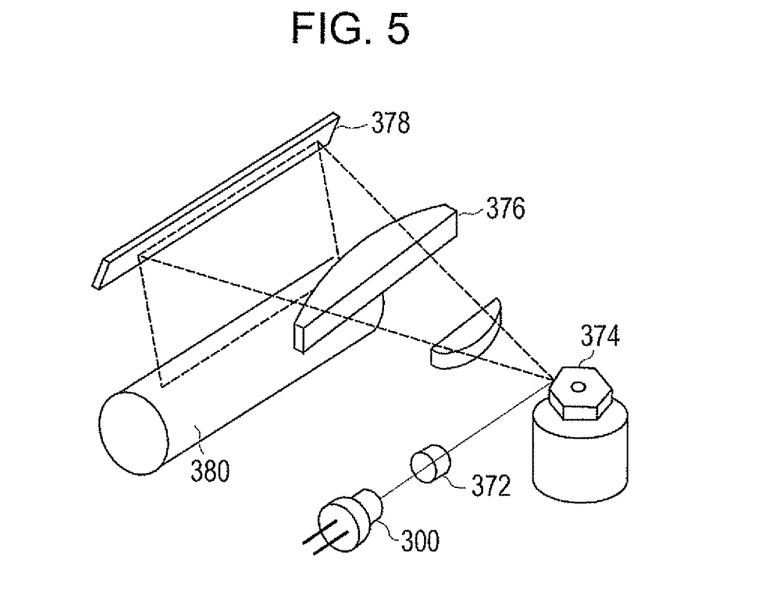
FIG. 5 is a diagram illustrating an example of a configuration of an optical information processing apparatus in which the VCSEL according to the present exemplary embodiment is used as a light source.

FIG. 5 is a diagram illustrating an example in which the VCSEL is applied as a light source of an optical information processing apparatus. An optical information processing apparatus 370 includes a collimator lens 372, a polygon mirror 374, an fθ lens 376, a reflection mirror 378, and a photoconductor drum (recording medium) 380. Laser light emitted from the VCSEL device 300 or 302 in which the VCSEL having a long resonator structure is implemented as illustrated in FIG. 4A or 4B enters the collimator lens 372. The polygon mirror 374 rotates at a fixed speed, and reflects, at a fixed angle of divergence, a pencil of light rays supplied from the collimator lens 372. Laser light emitted from the polygon mirror 374 enters the fθ lens 376, and the fθ lens 376 irradiates the reflection mirror 378 with the laser light. The reflection mirror 378 has a line shape. The photoconductor drum (recording medium) 380 forms a latent image on the basis of light reflected by the reflection mirror 378. As described above, the VCSEL can be utilized as a light source of an optical information processing apparatus, such as a copier or a printer including an optical system that gathers laser light, which is emitted by the VCSEL, onto a photoconductor drum, and a mechanism that scans the gathered laser light on the photoconductor drum.

Figure 6:
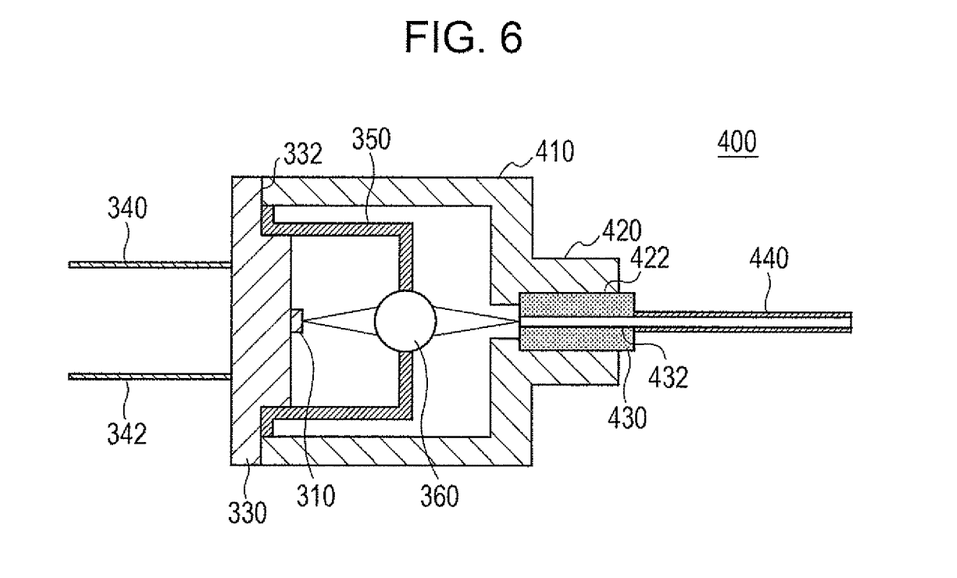
FIG. 6 is a schematic cross-sectional view illustrating a configuration of an optical transmission apparatus in which the VCSEL device illustrated in FIG. 4A is used.

FIG. 6 is a cross-sectional view illustrating a configuration in a case in which the VCSEL device illustrated in FIG. 4A is applied in an optical transmission apparatus. An optical transmission apparatus 400 includes a housing 410, a sleeve 420, a ferrule 430, and an optical fiber 440. The housing 410 is fixed in the stem 330, and has a cylindrical shape. The sleeve 420 is formed on the end face of the housing 410 so that the sleeve 420 and the housing 410 are formed as one piece. The ferrule 430 is held in an opening 422 of the sleeve 420. The optical fiber 440 is held by the ferrule 430. An end portion of the housing 410 is fixed to a flange 332 that is formed in the stem 330 in the circumferential direction. The ferrule 430 is accurately positioned in the opening 422 of the sleeve 420. The optical axis of the optical fiber 440 is made to match with the optical axis of the ball lens 360. A core wire of the optical fiber 440 is held in a through hole 432 of the ferrule 430.

Laser light emitted from the surface of the chip 310 is gathered by the ball lens 360. The gathered light enters the core wire of the optical fiber 440, and transmitted. Although the ball lens 360 is used in the above-described example, a lens other than a ball lens, such as a double-convex lens or a plano-convex lens, may be used. Furthermore, the optical transmission apparatus 400 may include a driving circuit for applying electric signals to the leads 340 and 342. Moreover, the optical transmission apparatus 400 may include a reception function for receiving a light signal via the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A vertical cavity surface emitting laser comprising:
   a semiconductor substrate;
   a first semiconductor multilayer film reflector which is laminated on the semiconductor substrate, in which a pair of a high-refractive-index layer having a comparatively high refractive index and a low-refractive-index layer having a low refractive index is stacked, and which is of a first conductivity type;
   a resonator that includes an active layer laminated on the first semiconductor multilayer film reflector; and
   a second semiconductor multilayer film reflector which is laminated on the resonator, in which a pair of a high-refractive-index layer having a comparatively high refractive index and a low-refractive-index layer having a low refractive index is stacked, and which is of a second conductivity type that is different from the first conductivity type,
   wherein an optical thickness of the resonator is larger than an emission wavelength of the vertical cavity surface emitting laser, and at least two resonant wavelengths are within a reflection wavelength band of at least one of the first and second semiconductor multilayer film reflectors, and
   wherein the resonator includes a pair of spacer layers that are laminated on the top and bottom of the active layer and a resonator extending region that is formed so as to be adjacent to one of the pair of spacer layers, a composition of at least a layer included in the resonator extending region is different from any of compositions of the semiconductor substrate, the first semiconductor multilayer film reflector, and the second semiconductor multilayer film reflector, and a lattice constant of a crystal forming the resonator extending region is smaller than a lattice constant of a crystal forming the first or second semiconductor multilayer film reflector.

2. The vertical cavity surface emitting laser according to claim 1, wherein a difference between the lattice constant of the crystal forming the resonator extending region and a lattice constant of a crystal forming the semiconductor substrate is smaller than the difference between the lattice constant of each of the crystals forming the first and second semiconductor multilayer film reflectors and the lattice constant of the crystal forming the semiconductor substrate.

3. The vertical cavity surface emitting laser according to claim 1, wherein a compressive strain is placed on the first or second semiconductor multilayer film reflector, and a tensile strain is placed on the resonator extending region.

4. The vertical cavity surface emitting laser according to claim 1, wherein one spacer layer of the pair of spacer layers is a lower spacer layer that is laminated on the bottom surface of the active layer, and the resonator extending region is laminated between the lower spacer layer and the first semiconductor multilayer film reflector.

5. The vertical cavity surface emitting laser according to claim 4, wherein the resonator further includes another semiconductor layer that is laminated between the resonator extending region and the lower spacer layer and that is of the first conductivity type.

6. The vertical cavity surface emitting laser according to claim 1, wherein the resonator extending region comprises a dopant to reduce the lattice constant of the crystal forming the first or second semiconductor multilayer film reflector, and the resonator extending region is of a conductivity type that is the same as the conductivity type of the first or second semiconductor multilayer film reflector.

7. The vertical cavity surface emitting laser according to claim 1, wherein the composition of the semiconductor substrate is GaAs, the first and second semiconductor multilayer film reflectors comprise a plurality of kinds of AlGaAs layers, each of the plurality of kinds of AlGaAs layers having a composition, the compositions of the plurality of kinds of AlGaAs layers having different aluminum contents, and the composition of the resonator extending region is AlGaAsP.

8. The vertical cavity surface emitting laser according to claim 1, wherein the composition of the semiconductor substrate is GaAs, the first and second semiconductor multilayer film reflectors comprise a plurality of kinds of AlGaAs layers, each of the plurality of kinds of AlGaAs layers having a composition, the compositions of the plurality of kinds of AlGaAs layers having different aluminum contents, and the composition of the resonator extending region is AlGaInP.

9. The vertical cavity surface emitting laser according to claim 7, wherein a ratio of a phosphorus dopant in the resonator extending region is within a range of values that reduce occurrence of misfit dislocation.

10. The vertical cavity surface emitting laser according to claim 1, including
a current confinement layer that is positioned adjacent to the resonator,
the current confinement layer including
an oxidized region that is selectively oxidized, and
an electrically conductive region around which the oxidized region is formed,
wherein at least the second semiconductor multilayer film reflector, the resonator, and the current confinement layer are shaped into a columnar structure on the semiconductor substrate.

11. A vertical-cavity-surface-emitting-laser device comprising:
the vertical cavity surface emitting laser according to claim 1; and
an optical member that light emitted from the vertical cavity surface emitting laser enters.

12. An optical transmission apparatus comprising:
the vertical-cavity-surface-emitting-laser device according to claim 11; and
a transmission unit that transmits, via an optical medium, laser light emitted from the vertical-cavity-surface-emitting-laser device.

13. An information processing apparatus comprising:
the vertical cavity surface emitting laser according to claim 1;
a light gathering unit that gathers, onto a recording medium, laser light which is emitted from the vertical cavity surface emitting laser; and
a mechanism that scans the laser light, which has been gathered by the light gathering unit, on the recording medium.

* * * * *